(12) United States Patent
Park et al.

(10) Patent No.: US 9,349,781 B2
(45) Date of Patent: May 24, 2016

(54) ORGANIC LIGHT EMITTING DIODE DISPLAY AND METHOD OF MANUFACTURING THE SAME

(71) Applicant: Samsung Display Co., Ltd., Yongin, Gyeonggi-Do (KR)

(72) Inventors: Kyung-Min Park, Yongin (KR); Ji-Yong Park, Yongin (KR); Tae-Gon Kim, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 30 days.

(21) Appl. No.: 13/961,050

(22) Filed: Aug. 7, 2013

(65) Prior Publication Data

US 2014/0138644 A1 May 22, 2014

(30) Foreign Application Priority Data

Nov. 20, 2012 (KR) .......................... 10-2012-0131909

(51) Int. Cl.
*H01L 27/32* (2006.01)
*H01L 51/56* (2006.01)
*H01L 27/12* (2006.01)
*G09G 3/32* (2016.01)

(52) U.S. Cl.
CPC ........ *H01L 27/3262* (2013.01); *H01L 27/1222* (2013.01); *G09G 3/3233* (2013.01); *G09G 2300/0861* (2013.01)

(58) Field of Classification Search
None
See application file for complete search history.

(56) References Cited

U.S. PATENT DOCUMENTS

| 5,623,165 | A | * | 4/1997 | Yamauchi | H01L 21/28035 257/270 |
|---|---|---|---|---|---|
| 5,945,777 | A | * | 8/1999 | Janning | H01J 1/308 313/310 |
| 7,994,522 | B2 | | 8/2011 | Ha et al. | |
| 8,067,765 | B2 | | 11/2011 | Lee et al. | |
| 8,093,603 | B2 | | 1/2012 | Jung et al. | |
| 8,237,354 | B2 | | 8/2012 | Kim et al. | |
| 8,354,677 | B2 | | 1/2013 | Park et al. | |

(Continued)

FOREIGN PATENT DOCUMENTS

| KR | 10-0685831 B1 | 2/2007 |
|---|---|---|
| KR | 10-0796606 B1 | 1/2008 |
| KR | 10-2008-0054858 A | 6/2008 |

*Primary Examiner* — Michael Lebentritt
*Assistant Examiner* — Jordan Klein
(74) *Attorney, Agent, or Firm* — Robert E. Bushnell, Esq.

(57) ABSTRACT

An organic light emitting diode display includes: a substrate; a semiconductor layer formed on the substrate and including a switching semiconductor layer, a driving semiconductor layer, and a light emission control semiconductor layer spaced apart from each other; a first gate insulating layer covering the semiconductor layer; a light emission control gate electrode formed on the first gate insulating layer and overlapping the light emission control semiconductor layer; a second gate insulating layer covering the light emission control gate electrode; a switching gate electrode and a driving gate electrode formed on the second gate insulating layer and respectively overlapping the switching semiconductor layer and the driving semiconductor layer; and an interlayer insulating layer covering the switching gate electrode, the driving gate electrode, and the second gate insulating layer. A doping concentration of a channel region of the driving semiconductor layer is higher than a doping concentration of a channel region of the light emission control semiconductor layer.

11 Claims, 13 Drawing Sheets

(56) References Cited

U.S. PATENT DOCUMENTS

| | | | |
|---|---|---|---|
| 2004/0179005 A1* | 9/2004 | Jo | G09G 3/325 345/211 |
| 2004/0195959 A1 | 10/2004 | Park et al. | |
| 2005/0161740 A1 | 7/2005 | Park et al. | |
| 2007/0187677 A1 | 8/2007 | Park et al. | |
| 2010/0102713 A1* | 4/2010 | Seo | H01L 51/5237 313/504 |
| 2010/0200861 A1 | 8/2010 | Lee et al. | |
| 2011/0204388 A1* | 8/2011 | Jeong | H01L 51/5281 257/88 |
| 2011/0241010 A1* | 10/2011 | Park | H01L 27/1255 257/71 |

* cited by examiner

ORGANIC LIGHT EMITTING DIODE DISPLAY AND METHOD OF MANUFACTURING THE SAME

CLAIM OF PRIORITY

This application makes reference to, incorporates into this specification the entire contents of, and claims all benefits accruing under 35 U.S.C. §119 from an application earlier filed in the Korean Intellectual Property Office filed on Nov. 20, 2012 and there duly assigned Serial No. 10-2012-0131909.

BACKGROUND OF THE INVENTION

1. Field of the Invention

The present invention relates generally to an organic light emitting diode display and a method of manufacturing the same, and more particularly, to an organic light emitting diode display which broadens a driving range of a gate voltage applied to a driving transistor so as to display a lot of grayscales.

2. Description of the Related Art

An organic light emitting diode display includes two electrodes and an organic emission layer interposed therebetween. Electrons injected from a cathode that is one electrode and holes injected from an anode that is another electrode are bonded to each other in the organic emission layer to form an exciton, and light is emitted while the exciton discharges energy.

The organic light emitting diode display includes a plurality of pixels including an organic light emitting diode that is formed of a cathode, an anode and an organic emission layer, and a plurality of transistors and capacitors for driving the organic light emitting diode are formed in each pixel. A plurality of transistors basically includes a switching transistor and a driving transistor.

When light emitted from the organic light emitting diode is displayed so as to have a range from a black color to a white color according to a driving current Id flowing through the organic light emitting diode, an interval between a gate voltage displaying the black color and a gate voltage displaying the white color is defined as a driving range of the gate voltage. The higher the resolution of the organic light emitting diode display is, the lower the size of one pixel is, and thus, an amount of flowing current per the pixel is reduced, such that a driving range of a gate voltage applied to a gate electrode of the switching transistor and the driving transistor becomes narrow. Accordingly, it is difficult to adjust the magnitude of the gate voltage Vgs applied to the driving transistor so as to ensure a lot of grayscales.

The above information disclosed in this Background section is only for enhancement of an understanding of the background of the described technology and therefore it may contain information that does not form the prior art that is already known in this country to a person of ordinary skill in the art.

SUMMARY OF THE INVENTION

The present invention has been developed in an effort to provide an organic light emitting diode display which broadens a driving range of a gate voltage applied to a driving transistor so as to display a lot of grayscales.

An exemplary embodiment provides an organic light emitting diode display including: a substrate; a semiconductor layer formed on the substrate and including a switching semiconductor layer, a driving semiconductor layer, and a light emission control semiconductor layer spaced apart from each other; a first gate insulating layer covering the semiconductor layer; a light emission control gate electrode formed on the first gate insulating layer and overlapping the light emission control semiconductor layer; a second gate insulating layer covering the light emission control gate electrode; a switching gate electrode and a driving gate electrode formed on the second gate insulating layer and respectively overlapping the switching semiconductor layer and the driving semiconductor layer; and an interlayer insulating layer covering the switching gate electrode, the driving gate electrode, and the second gate insulating layer. A doping concentration of a channel region of the driving semiconductor layer may be higher than the doping concentration of the channel region of the light emission control semiconductor layer.

The doping concentration of the channel region of the driving semiconductor layer may be $2\times10^{11}$ to $5\times10^{13}$ /cm$^3$, and the doping concentration of the channel region of the light emission control semiconductor layer may be $9\times10^{10}$ /cm$^3$ or less.

A doping impurity of the channel region of the driving semiconductor layer and the doping impurity of the channel region of the light emission control semiconductor layer may be the same type of doping impurity.

The doping impurity of the channel region of the driving semiconductor layer and the doping impurity of the channel region of the light emission control semiconductor layer may each be any one selected from an N type impurity or a P type impurity and different types of doping impurities.

The organic light emitting diode display may further include: a scan line formed on the substrate and transferring a scan signal, a data line and a driving voltage line crossing the scan line and transferring a data signal and a driving voltage, respectively, a switching transistor connected to the scan line and the data line and including the switching semiconductor layer and the switching gate electrode, a driving transistor connected to a switching drain electrode of the switching transistor and including the driving semiconductor layer and the driving gate electrode, and an organic light emitting diode connected to a driving drain electrode of the driving transistor, in which the doping concentration of the channel region of the switching semiconductor layer may be the same as the doping concentration of the channel region of the driving semiconductor layer.

The first gate insulating layer and the second gate insulating layer may be formed between the driving semiconductor layer and the driving gate electrode of the driving transistor.

The first gate insulating layer and the second gate insulating layer may be formed between a switching semiconductor layer and a switching gate electrode of a switching transistor.

The organic light emitting diode display may further include: an operation control transistor turned-on by a light emission control signal transferred by a light emission control line spaced apart from the scan line to transfer the driving voltage to the driving transistor, and a light emission control transistor turned-on by the light emission control signal to transfer the driving voltage from the driving transistor to the organic light emitting diode, in which a first gate insulating layer may be formed between a light emission control semiconductor layer and a light emission control gate electrode of the light emission control transistor, and a doping concentration of a channel region of an operation control semiconductor layer of the operation control transistor may be the same as the doping concentration of the channel region of the light emission control semiconductor layer.

The organic light emitting diode display may further include: a compensation transistor turned-on by a scan signal to compensate a threshold voltage of the driving transistor and connected to the driving transistor, and an initialization transistor turned-on according to a prior scan signal transferred through a prior scan line spaced apart from a scan line to transfer an initialization voltage transferred through an initialization voltage line adjacent to the prior scan line to a driving gate electrode of the driving transistor, in which the first gate insulating layer and a second gate insulating layer may be formed in the compensation transistor and the initialization transistor, and the doping concentrations of the channel regions of a compensation semiconductor layer of the compensation transistor and an initialization semiconductor layer of the initialization transistor may be the same as the doping concentration of the channel region of a driving semiconductor layer.

The organic light emitting diode display may further include: a storage capacitor including a first storage capacitive plate formed on the first gate insulating layer and a second storage capacitive plate formed on the second gate insulating layer covering the first storage capacitive plate and overlapping the first storage capacitive plate, in which a driving voltage line may be connected to the second storage capacitive plate.

Another exemplary embodiment provides a method of manufacturing an organic light emitting diode display, including: forming a semiconductor layer on a substrate, performing first channel doping on the semiconductor layer, forming a first gate insulating layer covering the semiconductor layer, forming a light emission control gate electrode on the first gate insulating layer, performing second channel doping on the semiconductor layer by using the light emission control gate electrode as a blocking mask, forming a second gate insulating layer covering the light emission control gate electrode and the first gate insulating layer, forming a switching gate electrode and a driving gate electrode on the second gate insulating layer, performing source and drain doping on the semiconductor layer to form a driving semiconductor layer, a switching semiconductor layer, and a light emission control semiconductor layer, and forming an interlayer insulating layer covering the switching gate electrode and the driving gate electrode on the second gate insulating layer.

A doping concentration of a channel region of the driving semiconductor layer may be higher than the doping concentration of the channel region of the light emission control semiconductor layer.

A doping impurity used in the first channel doping and the doping impurity used in the second channel doping may be the same type of doping impurity.

A doping impurity used in the first channel doping and the doping impurity used in the second channel doping may be any one selected from an N type impurity or a P type impurity and different types of doping impurities.

According to the exemplary embodiments, it is impossible to broaden a driving range of a gate voltage applied to a driving transistor to display a lot of grayscales and, at the same time, improve a charge mobility of an operation control transistor and a light emission control transistor by forming a first gate insulating layer and a second gate insulating layer between a gate electrode and a semiconductor layer of the driving transistor, and by forming only the first gate insulating layer between the gate electrode and the semiconductor layer of the operation control transistor and the light emission control transistor.

Furthermore, a threshold voltage Vth of the driving transistor may be set to be the same as the threshold voltage Vth between the operation control transistor and the light emission control transistor by setting a doping concentration of a channel region of the semiconductor layer of the driving transistor to be higher than the doping concentration of the channel region of the semiconductor layer of the operation control transistor and the light emission control transistor.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
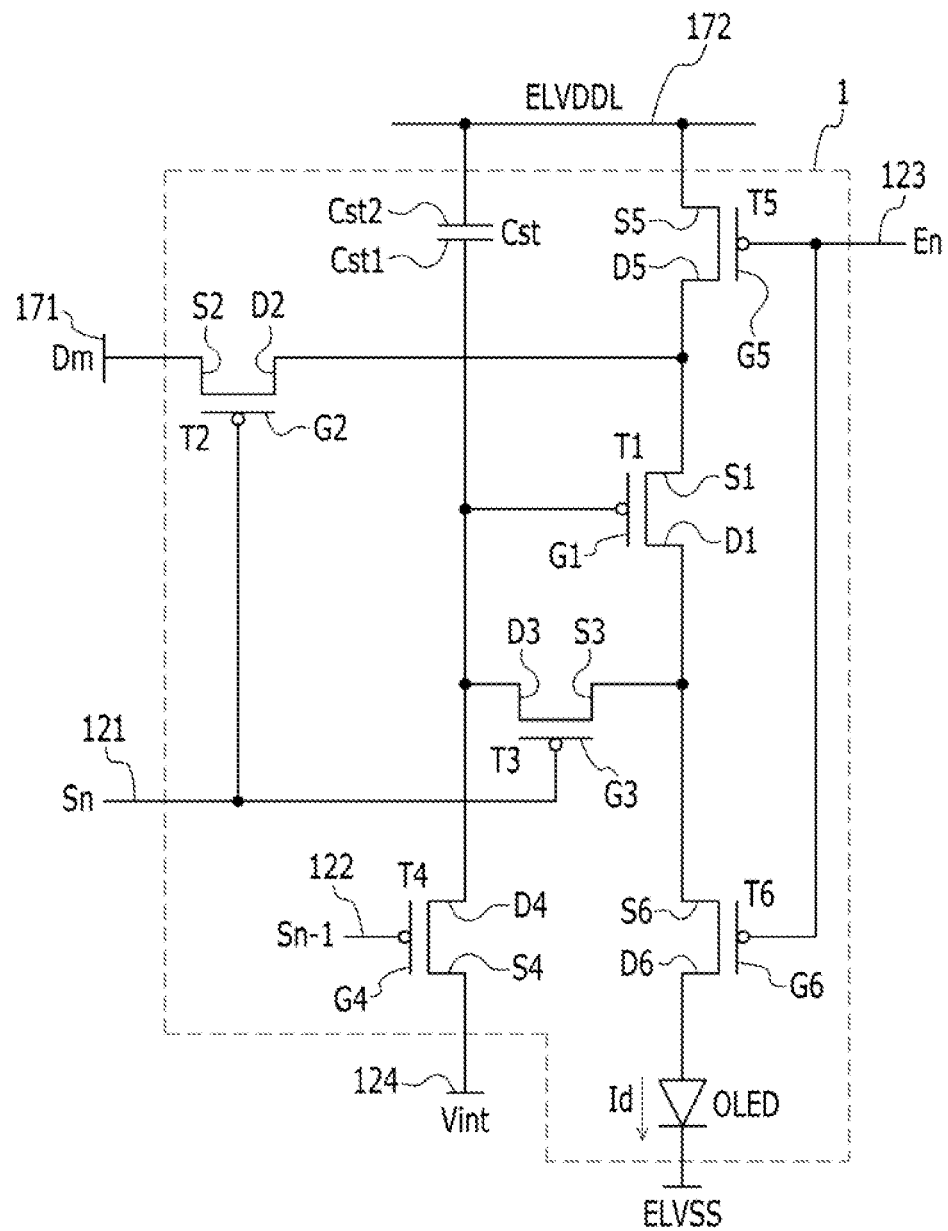
FIG. 1 is an equivalent circuit view of one pixel of an organic light emitting diode display according to an exemplary embodiment of the invention.

The present invention will be described more fully hereinafter with reference to the accompanying drawings, in which exemplary embodiments of the invention are shown. As those skilled in the art will realize, the described embodiments may be modified in various different ways, all without departing from the spirit or scope of the present invention.

The drawings and description are to be regarded as illustrative in nature and not restrictive. Like reference numerals designate like elements throughout the specification.

Furthermore, the size and thickness of each component shown in the drawings are arbitrarily shown for understanding and ease of description, but the present invention is not limited thereto.

In the drawings, the thickness of layers, films, panels, regions, etc. are exaggerated for clarity. In the drawings, for understanding and ease of description, the thickness of some layers and areas is exaggerated. It will be understood that when an element such as a layer, film, region or substrate is referred to as being "on" another element, it can be directly on the other element or intervening elements may also be present.

Furthermore, unless explicitly described to the contrary, the word "comprise" and variations such as "comprises" or "comprising" will be understood to imply the inclusion of stated elements but not the exclusion of any other elements. In addition, in the specification, the word "_on" means positioning on or below the object portion, but does not essentially mean positioning on the upper side of the object portion based on a gravity direction.

Furthermore, in the specification, the word "on a flat surface" means when an object portion is viewed from the above, and the word "on a cross section" means when a cross section taken by vertically cutting an object portion is viewed from the side.

An organic light emitting diode display according to an exemplary embodiment will now be described in detail with reference to FIGS. 1 to 5.

FIG. 1 is an equivalent circuit view of one pixel of an organic light emitting diode display according to an exemplary embodiment of the invention.

As illustrated in FIG. 1, one pixel 1 of the organic light emitting diode display according to the exemplary embodiment includes a plurality of signal lines 121, 122, 123, 124, 171, and 172, and a plurality of transistors T1, T2, T3, T4, T5, and T6, a storage capacitor Cst, and an organic light emitting diode (OLED) connected to a plurality of signal lines.

The transistors include a driving transistor (driving thin film transistor) T1, a switching transistor (switching thin film transistor) T2, a compensation transistor T3, an initialization transistor T4, an operation control transistor T5, and a light emission control transistor T6.

The signal lines include a scan line 121 transferring a scan signal Sn to the switching transistor T2 and the compensation transistor T3, a prior scan line 122 transferring a prior scan signal Sn−1 to the initialization transistor T4, a light emission control line 123 transferring a light emission control signal En to the operation control transistor T5 and the light emission control transistor T6, a data line 171 crossing the scan line 121 and transferring a data signal Dm to the switching transistor T2, a driving voltage line 172 transferring a driving voltage ELVDD and formed almost parallel to the data line 171, and an initialization voltage line 124 transferring an initialization voltage Vint to the initialization transistor T4 so as to initialize the driving transistor T1.

A gate electrode G1 of the driving transistor T1 is connected to an end Cst1 of the storage capacitor Cst, a source electrode S1 of the driving transistor T1 is connected via the operation control transistor T5 to the driving voltage line 172, and the drain electrode D1 of the driving transistor T1 is electrically connected via the light emission control transistor T6 to an anode of the organic light emitting diode (OLED). The driving transistor T1 receives the data signal Dm according to switching operation of the switching transistor T2 so as to supply a driving current Id to the organic light emitting diode (OLED).

A gate electrode G2 of the switching transistor T2 is connected to the scan line 121, a source electrode S2 of the switching transistor T2 is connected to the data line 171, and a drain electrode D2 of the switching transistor T2 is connected via the operation control transistor T5 to the driving voltage line 172 while being connected to the source electrode S1 of the driving transistor T1. The switching transistor T2 is turned-on according to the scan signal Sn transferred through the scan line 121 so as to perform a switching operation transferring the data signal Dm from the data line 171 to the source electrode S1 of the driving transistor T1.

A gate electrode G3 of the compensation transistor T3 is connected to the scan line 121, a source electrode S3 of the compensation transistor T3 is connected via the light emission control transistor T6 to the anode of the organic light emitting diode (OLED) while being connected to the drain electrode D1 of the driving transistor T1, and a drain electrode D3 of the compensation transistor T3 is connected to an end Cst1 of the storage capacitor Cst, to a drain electrode D4 of the initialization transistor T4, and the gate electrode G1 of the driving transistor T1. The compensation transistor T3 is turned-on according to the scan signal Sn transferred through the scan line 121 so as to connect the gate electrode G1 and the drain electrode D1 of the driving transistor T1 to each other, thus performing diode-connection of the driving transistor T1.

A gate electrode G4 of the initialization transistor T4 is connected to the prior scan line 122, the source electrode S4 of the initialization transistor T4 is connected to the initialization voltage line 124, and the drain electrode D4 of the initialization transistor T4 is connected to an end Cst1 of the storage capacitor Cst, to the drain electrode D3 of the compensation transistor T3, and to the gate electrode G1 of the driving transistor T1. The initialization transistor T4 is turned-on according to the prior scan signal Sn−1 transferred through the prior scan line 122 so as to transfer the initialization voltage Vint to the gate electrode G1 of the driving transistor T1, thus performing an initialization operation initializing the voltage of the gate electrode G1 of the driving transistor T1.

A gate electrode G5 of the operation control transistor T5 is connected to the light emission control line 123, a source electrode S5 of the operation control transistor T5 is connected to the driving voltage line 172, and a drain electrode D5 of the operation control transistor T5 is connected to the source electrode S1 of the driving transistor T1 and the drain electrode D2 of the switching transistor T2.

A gate electrode G6 of the light emission control transistor T6 is connected to the light emission control line 123, a source electrode S6 of the light emission control transistor T6 is connected to the drain electrode D1 of the driving transistor T1 and the source electrode S3 of the compensation transistor T3, and a drain electrode D6 of the light emission control transistor T6 is electrically connected to the anode of the organic light emitting diode (OLED). The operation control transistor T5 and the light emission control transistor T6 are simultaneously turned-on according to the light emission control signal En transferred through the light emission control line 123 so as to transfer the driving voltage ELVDD to the organic light emitting diode (OLED), thus allowing the driving current Id to flow in the organic light emitting diode (OLED).

Another end Cst2 of the storage capacitor Cst is connected to the driving voltage line 172, and a cathode of the organic light emitting diode (OLED) is connected to a common voltage ELVSS. Accordingly, the organic light emitting diode (OLED) receives the driving current Id from the driving transistor T1 so as to emit light, thereby displaying an image.

Hereinafter, a specific operation process of one pixel of the organic light emitting diode display according to the exemplary embodiment will be described in detail.

First, the prior scan signal Sn−1 at a low level is supplied through the prior scan line 122 during an initialization period. Then, the initialization transistor T4 is turned-on in correspondence to the prior scan signal Sn−1 at the low level, and the initialization voltage Vint is connected from the initialization voltage line 124 through the initialization transistor T4 to the gate electrode G1 of the driving transistor T1 so as to initialize the driving transistor T1 by the initialization voltage Vint.

Subsequently, the scan signal Sn at the low level is supplied through the scan line 121 during a data programming period. Then, the switching transistor T2 and the compensation transistor T3 are turned-on in correspondence to the scan signal Sn at the low level.

In this case, the driving transistor T1 is diode-connected by the turned-on compensation transistor T3, and biased in a forward direction. Then, a compensation voltage Dm+Vth (Vth is a negative value) obtained by subtracting a threshold voltage Vth of the driving transistor T1 from the data signal Dm supplied from the data line 171 is applied to the gate electrode of the driving transistor T1.

The driving voltage ELVDD and the compensation voltage Dm+Vth are applied to both ends of the storage capacitor Cst, and a charge corresponding to a difference between voltages at both ends is stored in the storage capacitor Cst. Thereafter, the level of the light emission control signal En supplied from the light emission control line 123 during the light emission period is changed from the high level to the low level. Then, the operation control transistor T5 and the light emission control transistor T6 are turned-on by the light emission control signal En at the low level during the light emission period.

Then, the driving current Id is generated according to a difference between the voltage of the gate electrode of the driving transistor T1 and the driving voltage ELVDD, and the driving current Id is supplied through the light emission control transistor T6 to the organic light emitting diode (OLED). A gate-source voltage Vgs of the driving transistor T1 is maintained at '(Dm+Vth)−ELVDD' by the storage capacitor Cst during the light emission period, and the driving current Id is proportional to a square of a value obtained by subtracting the threshold voltage from a source-gate voltage, that is, '(Dm−ELVDD)2', according to a current-voltage relationship of the driving transistor T1. Accordingly, the driving current Id is determined regardless of the threshold voltage Vth of the driving transistor T1.

Then, a detailed structure of the pixel of the organic light emitting diode display illustrated in FIG. 1 will be described in detail with reference to FIGS. 2 to 5 together with FIG. 1.

Figure 2:
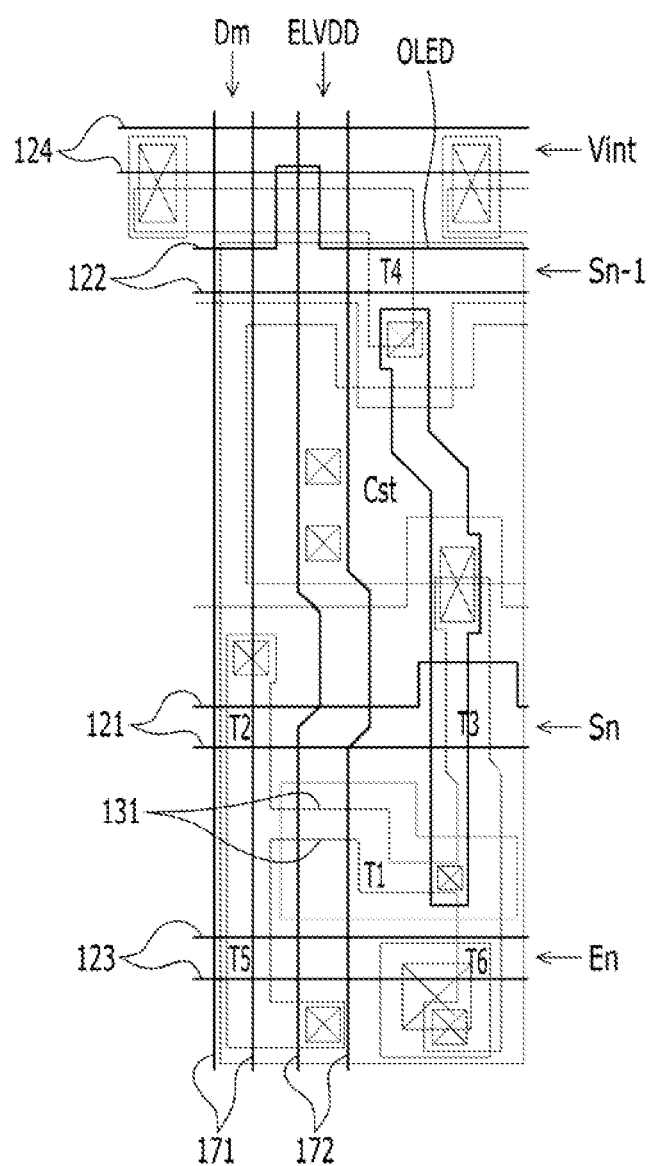
FIG. 2 is a view schematically illustrating a plurality of transistors and capacitors of the organic light emitting diode display according to the exemplary embodiment.
Figure 3:
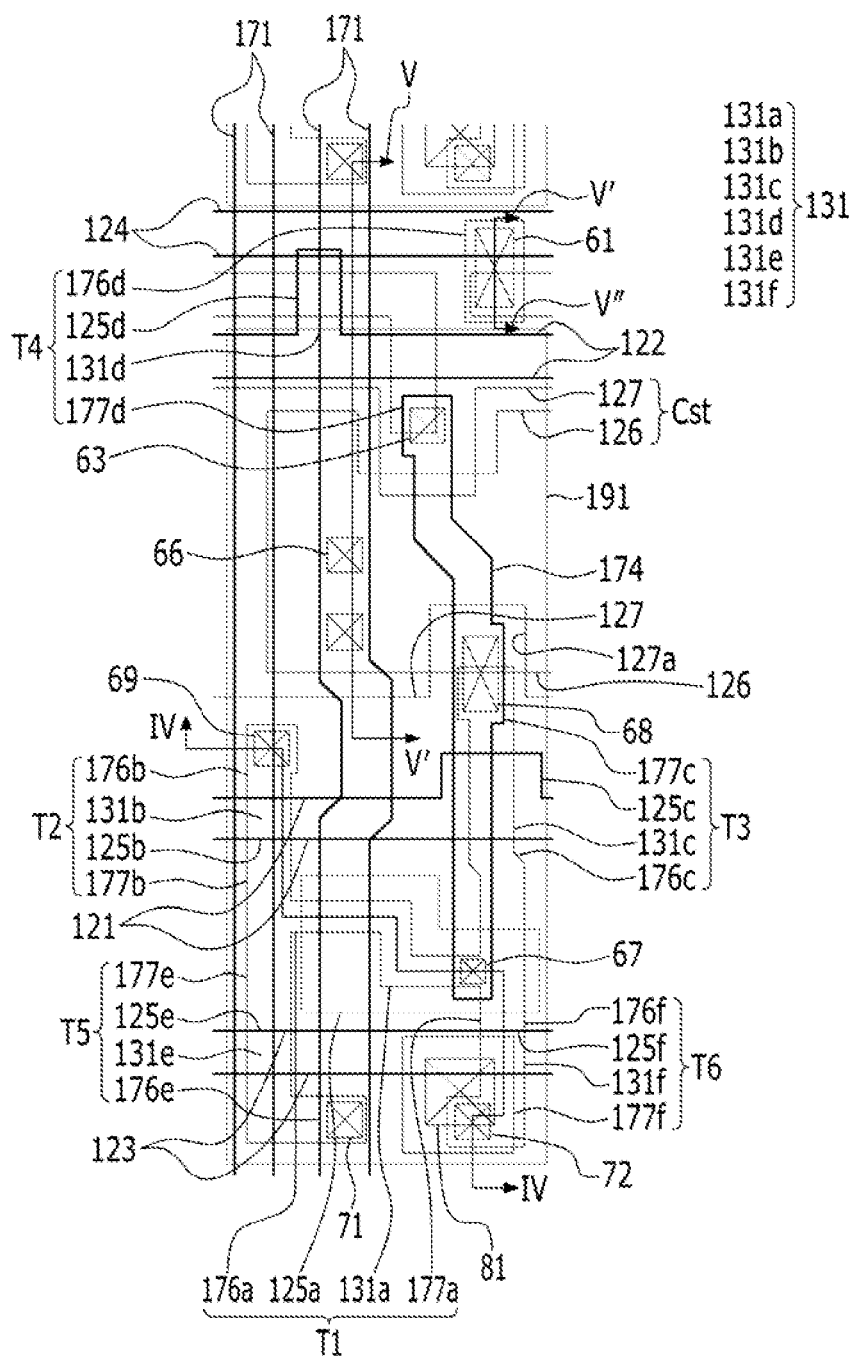
FIG. 3 is a specific layout view of one pixel of FIG. 2.
Figure 4:
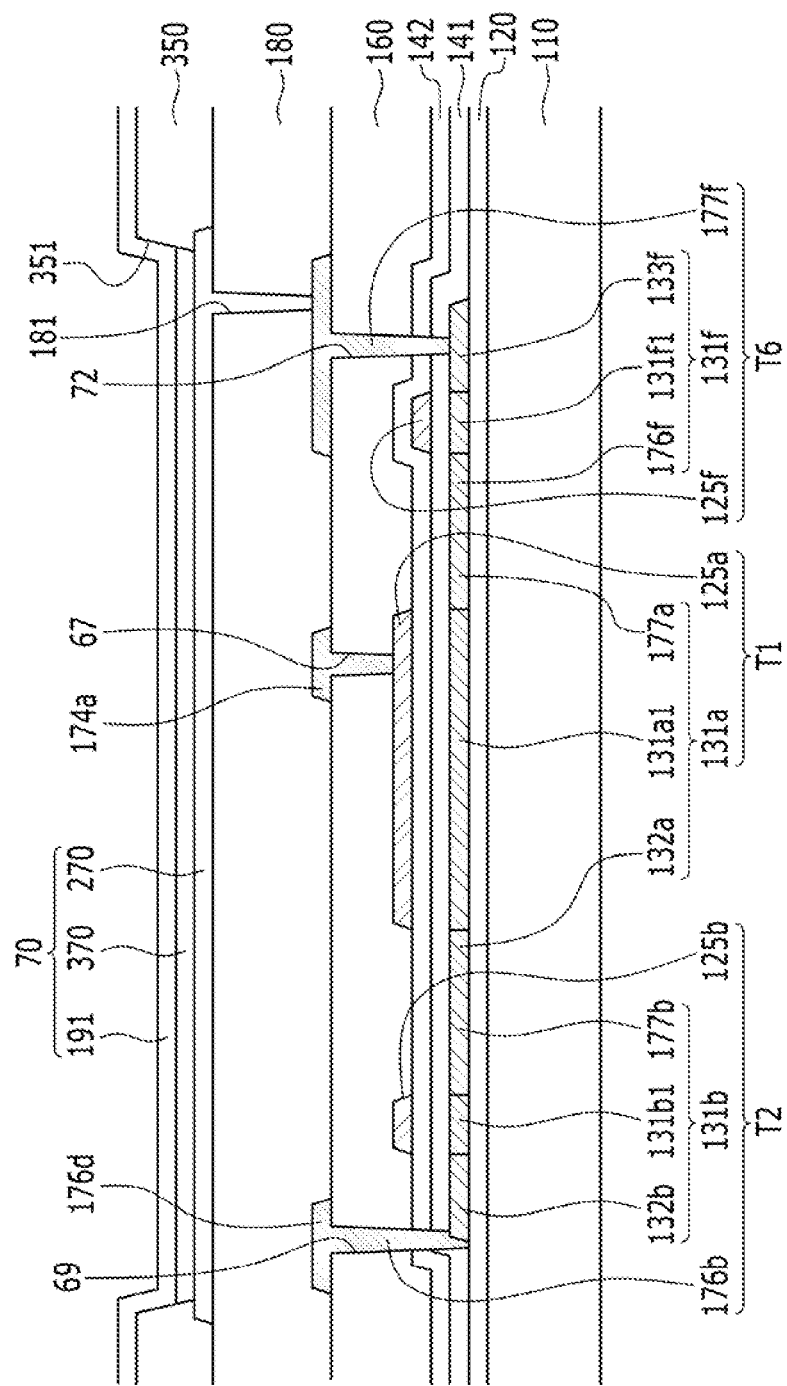
FIG. 4 is a cross-sectional view of the organic light emitting diode display of FIG. 3, which is taken along line IV-IV.
Figure 5:
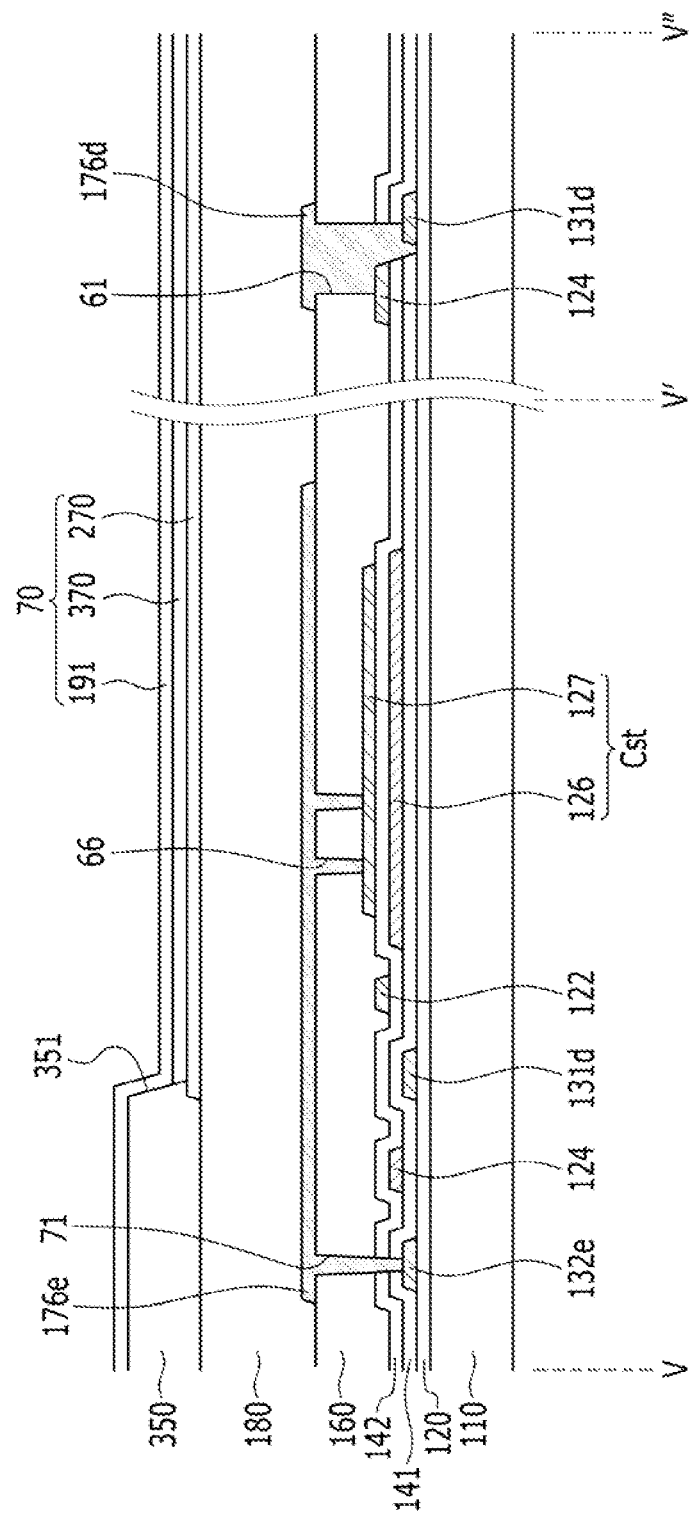
FIG. 5 is a cross-sectional view of the organic light emitting diode display of FIG. 3, which is taken along line V-V' and line V'-V".

FIG. 2 is a view schematically illustrating a plurality of transistors and capacitors of the organic light emitting diode display according to the exemplary embodiment, FIG. 3 is a specific layout view of one pixel of FIG. 2, FIG. 4 is a cross-sectional view of the organic light emitting diode display of FIG. 3, which is taken along line IV-IV, and FIG. 5 is a cross-sectional view of the organic light emitting diode display of FIG. 3, which is taken along line V-V' and line V'-V''.

As illustrated in FIG. 2, the organic light emitting diode display according to the exemplary embodiment includes the scan line 121, the prior scan line 122, the light emission control line 123, and the initialization voltage line 124 applying the scan signal Sn, the prior scan signal Sn−1, the light emission control signal En, and the initialization voltage Vint, respectively, and formed in a row direction, and the data line 171 and the driving voltage line 172 crossing all the scan line 121, the prior scan line 122, the light emission control line 123, and the initialization voltage line 124 and applying the data signal Dm and the driving voltage ELVDD, respectively, to the pixel.

Furthermore, the driving transistor T1, the switching transistor T2, the compensation transistor T3, the initialization transistor T4, the operation control transistor T5, the light emission control transistor T6, the storage capacitor Cst, and the organic light emitting diode (OLED) are formed in the pixel.

The driving transistor T1, the switching transistor T2, the compensation transistor T3, the initialization transistor T4, the operation control transistor T5, and the light emission control transistor T6 are formed along the semiconductor layer 131, and the semiconductor layer 131 is formed so as to be bent in various shapes. The semiconductor layer 131 may be formed of polysilicon or an oxide semiconductor. The oxide semiconductor may include any one of oxides having titanium (Ti), hafnium (Hf), zirconium (Zr), aluminum (Al), tantalum (Ta), germanium (Ge), zinc (Zn), gallium (Ga), tin (Sn), or indium (In) as a base, and complex oxides thereof, such as zinc oxide (ZnO), indium-gallium-zinc oxide (InGaZnO4), indium-zinc oxide (Zn—In—O), zinc-tin oxide (Zn—Sn—O) indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O). In the case where the semiconductor layer 131 is formed of the oxide semiconductor, a separate protective layer may be added to protect the oxide semiconductor that is weak to an external environment such as high temperatures.

The semiconductor layer 131 includes a channel region that is subjected to channel doping with an N type impurity or a P type impurity, and a source region and a drain region that are formed at both sides of the channel region and formed by doping a doping impurity having a type that is opposite to that of the doping impurity doped in the channel region.

Hereinafter, a specific flat surface type structure of the organic light emitting diode display according to the exemplary embodiment will be first described in detail with reference to FIGS. 2 and 3, and a specific lamination structure thereof will be described in detail with reference to FIGS. 4 and 5.

First, as illustrated in FIGS. 2 and 3, the pixel of the organic light emitting diode display according to the exemplary embodiment includes the driving transistor T1, the switching transistor T2, the compensation transistor T3, the initialization transistor T4, the operation control transistor T5, the light emission control transistor T6, the storage capacitor Cst, and the organic light emitting diode (OLED), the transistors T1, T2, T3, T4, T5, and T6 are formed along the semiconductor layer 131, and the semiconductor layer 131 includes a driving semiconductor layer 131a formed in the driving transistor T1, a switching semiconductor layer 131b formed in the switching transistor T2, a compensation semiconductor layer 131c formed in the compensation transistor T3, an initialization semiconductor layer 131d formed in the initialization transistor T4, an operation control semiconductor layer 131e formed in the operation control transistor T5, and a light emission control semiconductor layer 131f formed in the light emission control transistor T6.

The driving transistor T1 includes the driving semiconductor layer 131a, the driving gate electrode 125a, the driving source electrode 176a, and the driving drain electrode 177a.

The driving source electrode 176a corresponds to a driving source region 176a doped with the impurity in the driving semiconductor layer 131a, and the driving drain electrode 177a corresponds to a driving drain region 177a doped with the impurity in the driving semiconductor layer 131a. The driving gate electrode 125a overlaps the driving semiconductor layer 131a, and has an area that is larger than that of the driving semiconductor layer 131a.

The driving gate electrode 125a is formed of the same material as the scan line 121, the prior scan line 122, the switching gate electrode 125b, the compensation gate electrode 125c, the initialization gate electrode 125d, and the second storage capacitive plate 127 on the same layer.

The switching transistor T2 includes the switching semiconductor layer 131b, the switching gate electrode 125b, the switching source electrode 176b, and the switching drain electrode 177b. The switching source electrode 176b is a portion protruding from the data line 171, and the switching drain electrode 177b corresponds to a switching drain region 177b doped with an impurity in the switching semiconductor layer 131b.

The compensation transistor T3 includes the compensation semiconductor layer 131c, the compensation gate electrode 125c, a compensation source electrode 176c, and a compensation drain electrode 177c, the compensation source electrode 176c corresponds to a compensation source region 176c doped with the impurity in the compensation semiconductor layer 131c, and the compensation drain electrode 177c is a portion protruding from a connection member 174.

The initialization transistor T4 includes the initialization semiconductor layer 131d, the initialization gate electrode 125d, an initialization source electrode 176d, and an initialization drain electrode 177d. The initialization source electrode 176d is connected through a contact hole 61 continuously formed in a first gate insulating layer 141, a second gate insulating layer 142, and an interlayer insulating layer 160 to the initialization voltage line 124 and the initialization semiconductor layer 131d simultaneously, and the initialization drain electrode 177d is another end of the connection member 174 and is connected through a contact hole 63 continuously formed in a first gate insulating layer 141, a second gate insulating layer 142, and the interlayer insulating layer 160 to the initialization semiconductor layer 131d.

The operation control transistor T5 includes the operation control semiconductor layer 131e, an operation control gate electrode 125e, an operation control source electrode 176e, and an operation control drain electrode 177e. The operation control source electrode 176e is a portion of the driving voltage line 172 and is connected through a contact hole 71 to an operation control source region 132e, and the operation control drain electrode 177e corresponds to an operation control drain region 177e doped with an impurity in the operation control semiconductor layer 131e.

The light emission control transistor T6 includes the light emission control semiconductor layer 131f, a light emission control gate electrode 125f, a light emission control source electrode 176f, and a light emission control drain electrode 177f. The light emission control source electrode 176f corresponds to a light emission control source region 176f doped with the impurity in the light emission control semiconductor layer 131f.

An end of the driving semiconductor layer 131a of the driving transistor T1 is connected to the switching semiconductor layer 131b and the operation control semiconductor layer 131e, and another end of the driving semiconductor layer 131a is connected to the compensation semiconductor layer 131c and the light emission control semiconductor layer 131f. Therefore, the driving source electrode 176a is connected to the switching drain electrode 177b and the operation control drain electrode 177e, and the driving drain electrode 177a is connected to the compensation source electrode 176c and the light emission control source electrode 176f.

The storage capacitor Cst includes a first storage capacitive plate 126 and a second storage capacitive plate 127 with the second gate insulating layer 142 interposed therebetween. Herein, the second gate insulating layer 142 is a dielectric material, and a storage capacitance is determined by charges accumulated in the storage capacitor Cst and a voltage between both capacitive plates 126 and 127.

The first storage capacitive plate 126 is formed of the same material as the light emission control line 123, the initialization voltage line 124, the operation control gate electrode 125e, and the light emission control gate electrode 125f on the same layer, and the second storage capacitive plate 127 is formed of the same material as the scan line 121, the prior scan line 122, the driving gate electrode 125a, the switching gate electrode 125b, the compensation gate electrode 125c, and the initialization gate electrode 125d on the same layer. The first storage capacitive plate 126 and the second storage capacitive plate 127 may be formed of a gate wire including one or more metals of aluminum (Al), chromium (Cr), molybdenum (Mo), titanium (Ti), tantalum (Ta), an Al—Ni—La alloy, and an Al—Nd alloy. Therefore, the storage capacitance may be improved as compared to a structure in which any one capacitive plate of the storage capacitor Cst is formed of the semiconductor layer.

Furthermore, the driving voltage line 172 extending to overlap the storage capacitor Cst extends to cross the initialization voltage line 124, the prior scan line 122, and the initialization transistor T4. A portion of the driving voltage line 172 corresponds to the operation control source electrode 176e and is connected through a contact hole 71 to the operation control source region 132e, and another portion of the driving voltage line 172 is connected through a contact hole 66 formed in the interlayer insulating layer 160 to the second storage capacitive plate 127.

A connection member 174 is formed in parallel with the driving voltage line 172 on the same layer. The connection member 174 connects the driving gate electrode 125a and the first storage capacitive plate 126 to each other. An end 174a of the connection member 174 is connected through a contact hole 67 formed in the interlayer insulating layer 160 to the driving gate electrode 125a, and another end 177d of the connection member 174 corresponds to the initialization drain electrode 177d of the initialization transistor T4, and is connected through a contact hole 63 continuously formed in the first gate insulating layer 141, the second gate insulating layer 142, and the interlayer insulating layer 160 to the initialization semiconductor layer 131d of the initialization transistor T4. Furthermore, a middle protruding portion 177c of the connection member 174 corresponds to the compensation drain electrode 177c of the compensation transistor T3, and is connected through a contact hole 68 continuously formed in the first gate insulating layer 141, the second gate insulating layer 142, and the interlayer insulating layer 160 to the compensation semiconductor layer 131c of the compensation transistor T3. Furthermore, the middle protruding portion 177c of the connection member 174 is connected, through the contact hole 68 formed in the second gate insulating layer 142 and the interlayer insulating layer 160 positioned in a storage opening 127a, to the first storage capacitive plate 126.

Accordingly, the first storage capacitive plate 126 of the storage capacitor Cst is connected through the middle protruding portion 177c and another end 177d of the connection member 174 to the compensation semiconductor layer 125c and the initialization semiconductor layer 125d, respectively, and is connected through an end 174a of the connection member 174 to the driving gate electrode 125a. In addition, the second storage capacitive plate 127 of the storage capacitor Cst is connected through the contact hole 66 formed in the interlayer insulating layer 160 to the driving voltage line 172. In this case, the storage opening 127a through which the middle protruding portion 177c of the connection member 174 and the first storage capacitive plate 126 are connected to each other is formed in the second storage capacitive plate 127.

Accordingly, the storage capacitor Cst stores a storage capacitance corresponding to a difference between the driving voltage ELVDD transferred through the driving voltage line 172 and the gate voltage of the driving gate electrode 125a.

Meanwhile, the switching transistor T2 is used as a switching element selecting the pixel that is to emit light. The switching gate electrode 125b is connected to the scan line 121, the switching source electrode 176b is connected to the data line 171, and the switching drain electrode 177b is connected to the driving transistor T1 and the operation control transistor T5. In addition, the light emission control drain electrode 177f of the light emission control transistor T6 is directly connected through a contact hole 181 formed in a protective layer 180 to a pixel electrode 191 of an organic light emitting diode 70.

Hereinafter, referring to FIGS. 5 and 6, a structure of the organic light emitting diode display according to the exemplary embodiment will be described in detail according to the lamination order.

In this case, the structure of the transistor will be described based on the driving transistor T1, the switching transistor T2, and the light emission control transistor T6. In addition, the compensation transistor T3 and the initialization transistor T4 have almost the same lamination structure as the driving transistor T1 and the switching transistor T2, and the operation control transistor T5 has almost the same lamination structure as the light emission control transistor T6, which is not described in further detail.

A buffer layer 120 is formed on the substrate 110, and the substrate 110 is formed of an insulating substrate made of glass, quartz, ceramics, plastics or the like.

The driving semiconductor layer 131a, the switching semiconductor layer 131b, and the light emission control semiconductor layer 131f are formed on the buffer layer 120. The driving semiconductor layer 131a includes a driving channel region 131a1 and a driving source region 176a and a driving drain region 177a facing each other with the driving channel region 131a1 interposed therebetween, the switching semiconductor layer 131b includes a switching channel region 131b1 and a switching source region 132b and a switching drain region 177b facing each other with the switching channel region 131b1 interposed therebetween, and the light emission control transistor T6 includes a light emission control channel region 131f1, the light emission control source region 176f, and a light emission control drain region 133f.

The driving channel region 131a1 may be doped with a P type impurity, for example, boron (B), and the driving source region 176a and the driving drain region 177a may be doped with an N type impurity, for example, phosphorus (P). Furthermore, the switching channel region 131b1 and the light emission control channel region 131f1 may be doped with the P type impurity, and the driving source region 176a, the driving drain region 177a, the light emission control source region 176f, and the light emission control drain region 133f may be doped with the N type impurity.

In this case, the doping concentration of the driving channel region 131a1 may be higher than the doping concentration of the light emission control channel region 131f1. As described above, the doping concentration may be adjusted to prevent deviation between the threshold voltage of the driving transistor T1 and the threshold voltage of the light emission control transistor T6 occurring in the case where the first gate insulating layer 141 and the second gate insulating layer 142 are formed between the driving gate electrode 125a and the driving semiconductor layer 131a of the driving transistor T1 and in the case where only the first gate insulating layer 141 is formed between the light emission control gate electrode 125f and the light emission control semiconductor layer 131f of the light emission control transistor T6. That is, since the threshold voltage of the driving transistor T1 is increased so as to cause the deviation between the threshold voltage of the driving transistor T1 and the threshold voltage of the light emission control transistor T6, a margin of the threshold voltage of the driving transistor T1 may be reduced so as to cause a problem such as stain defects, such that the deviation between the threshold voltage of the driving transistor T1 and the threshold voltage of the light emission control transistor T6 may be minimized by setting the doping concentration of the driving channel region 131a1 to be higher than the doping concentration of the light emission control channel region 131f1. In this case, the doping concentration of the switching channel region 131b1 may be the same as the doping concentration of the driving channel region 131a1, the doping concentration of the channel region of the compensation semiconductor layer 131c and the initialization semiconductor layer 131d may be the same as the doping concentration of the driving channel region 131a1, and the doping concentration of the channel region of the operation control semiconductor layer 131e of the operation control transistor T5 may be the same as the doping concentration of the light emission control channel region 131f1.

Meanwhile, in the above, doping impurities of all of the channel regions are formed of the same type of doping impurity, but the doping impurities of the driving channel region 131a1 and the switching channel region 131b1 may be doped with a doping impurity having a type that is opposite to that of the doping impurity of the light emission control channel region 131f1. That is, the doping impurity of the driving channel region 131a1 and the switching channel region 131b1 may be a P type impurity, and the doping impurity of the light emission control channel region 131f1 may be an N type impurity. Furthermore, to the contrary, the doping impurity of the driving channel region 131a1 and the switching channel region 131b1 may be an N type impurity, and the doping impurity of the light emission control channel region 131f1 may be a P type impurity.

The first gate insulating layer 141, formed of silicon nitride ($SiN_x$) or silicon oxide ($SiO_2$) is formed on the switching semiconductor layer 131a, the driving semiconductor layer 131b, and the light emission control semiconductor layer 131f.

First gate wires 123, 125e, 125f, 124, and 126, including the operation control gate electrode 125e, the light emission control line 123 including the light emission control gate electrode 125f, the initialization voltage line 124, and the first storage capacitive plate 126, are formed on the first gate insulating layer 141.

The second gate insulating layer 142 is formed on the first gate wires 123, 125e, 125f, 124, and 126 and the first gate insulating layer 141. The second gate insulating layer 142 is formed of silicon nitride ($SiN_x$) or silicon oxide ($SiO_2$).

Second gate wires 125a, 125b, 125c, 121, 122, and 127, including the scan lines 121 including the driving gate electrode 125a, the switching gate electrode 125b, and the compensation gate electrode 125c, the prior scan line 122, and the second storage capacitive plate 127, are formed on the second gate insulating layer 142.

As described above, the first gate insulating layer 141 and the second gate insulating layer 142 are formed between the driving semiconductor layer 131a and the driving gate electrode 125a so as to increase an interval between the driving semiconductor layer 131a and the driving gate electrode 125a. Accordingly, the driving range of the gate voltage applied to the driving gate electrode 125a is broadened to display all grayscales.

The interlayer insulating layer 160 is formed on the second gate wires 125a, 125b, 125c, 121, 122, and 127 and the second gate insulating layer 142. Like the first gate insulating layer 141 and the second gate insulating layer 142, the interlayer insulating layer 160 is made of a ceramic-based material such as silicon nitride ($SiN_x$) or silicon oxide ($SiO_2$).

Data wires including the data line 171 including the switching source electrode 176b, the connection member 174 including the initialization drain electrode 177d and the compensation drain electrode 177c, the light emission control drain electrode 177f, and the driving voltage line 172 including the driving control source electrode 176e are formed on the interlayer insulating layer 160.

In addition, the light emission control drain electrode 177f is connected, through the contact hole 72 formed in the first gate insulating layer 141, the second gate insulating layer 142, and the interlayer insulating layer 160, to the light emission control drain region 133f of the light emission control semiconductor layer 131f. In addition, the middle protruding portion 177c of the connection member 174 is connected, through the contact hole 68 continuously formed in the second gate insulating layer 142 and the interlayer insulating layer 160, to the first storage capacitive plate 126, and the middle protruding portion 177c of the connection member 174 is connected, through the contact hole 68 continuously formed in the first gate insulating layer 141, the second gate insulating layer 142, and the interlayer insulating layer 160, to the compensation semiconductor layer 131c of the compensation transistor T3.

The protective layer 180 covering the data wires 171, 172, 174, and 177f is formed on the interlayer insulating layer 160, and the pixel electrode 191 is formed on the protective layer 180. The pixel electrode 191 is connected, through the contact hole 181 formed in the protective layer 180, to the light emission control drain electrode 177f.

A barrier rib 350 is formed on an edge of the pixel electrode 191 and the protective layer 180, and the barrier rib 350 has a barrier rib opening 351 through which the pixel electrode 191 is exposed. The barrier rib 350 may be made of resins, such as polyacrylates and polyimides or silica-based inorganic materials.

An organic emission layer 370 is formed on the pixel electrode 191 exposed through the barrier rib opening 351, and the common electrode 270 is formed on the organic emission layer 370. As described above, the organic light emitting diode 70 including the pixel electrode 191, the organic emission layer 370, and the common electrode 270 is formed.

Herein, the pixel electrode 191 is an anode that is a hole injection electrode, and the common electrode 270 is a cathode that is an electron injection electrode. However, the exemplary embodiment according to the present invention is not limited thereto, and the pixel electrode 191 may be the cathode and the common electrode 270 may be the anode according to the driving method of the organic light emitting diode display. Holes and electrons are injected from the pixel electrode 191 and the common electrode 270 into the organic emission layer 370, and when an exciton that is bonded to the injected holes and electrons falls from an exited state to a bottom state, light is emitted.

The organic emission layer 370 is formed of a low molecular weight organic material or a high molecular weight organic material such as PEDOT (poly 3,4-ethylenedioxythiophene). Furthermore, the organic emission layer 370 may be formed of a multilayer including one or more of an emission layer, a hole injection layer HIL, a hole transport layer HTL, an electron transport layer ETL, and an electron injection layer EIL. In the case where all of the layers are included, the hole injection layer HIL is disposed on the pixel electrode 191 that is the anode, and the hole transport layer HTL, the emission layer, the electron transport layer ETL, and the electron injection layer EIL are sequentially laminated thereon.

The organic emission layer 370 may include a red organic emission layer emitting light having a red color, a green organic emission layer emitting light having a green color, and a blue organic emission layer emitting light having a blue color, and the red organic emission layer, the green organic emission layer, and the blue organic emission layer are respectively formed in a red pixel, a green pixel, and a blue pixel to implement a color image.

Furthermore, the organic emission layer 370 may implement the color image by laminating all of the red organic emission layer, the green organic emission layer, and the blue organic emission layer in the red pixel, the green pixel, and the blue pixel together, and forming a red color filter, a green color filter, and a blue color filter for each pixel. As another example, a white organic emission layer emitting light having a white color may be formed in all of the red pixel, the green pixel, and the blue pixel, and the red color filter, the green color filter, and the blue color filter may be formed for each pixel so as to implement the color image. In the case where the color image is implemented by using the white organic emission layer and the color filter, deposition masks for depositing the red organic emission layer, the green organic emission layer, and the blue organic emission layer on each pixel, that is, the red pixel, the green pixel, and the blue pixel, may not be used.

Needless to say, the white organic emission layer described in another example may be formed of one organic emission layer, and includes even a constitution in which a plurality of organic emission layers is laminated to emit light having the white color. For example, a constitution in which at least one yellow organic emission layer and at least one blue organic emission layer are combined to emit light having the white color, a constitution in which at least one cyan organic emission layer and at least one red organic emission layer are combined to emit light having the white color, a constitution in which at least one magenta organic emission layer and at least one green organic emission layer are combined to emit light having the white color, or the like, may be included.

Since the common electrode 270 is formed of a reflective conductive material, a rear surface light emission type organic light emitting diode display is obtained. Material such as lithium (Li), calcium (Ca), lithium fluoride/calcium (LiF/Ca), lithium fluoride/aluminum (LiF/Al), aluminum (Al), silver (Ag), magnesium (Mg), or gold (Au) may be used as the reflective material.

Next, a method of manufacturing the organic light emitting diode display according to the exemplary embodiment will be described in detail with reference the drawings.

Figure 6:
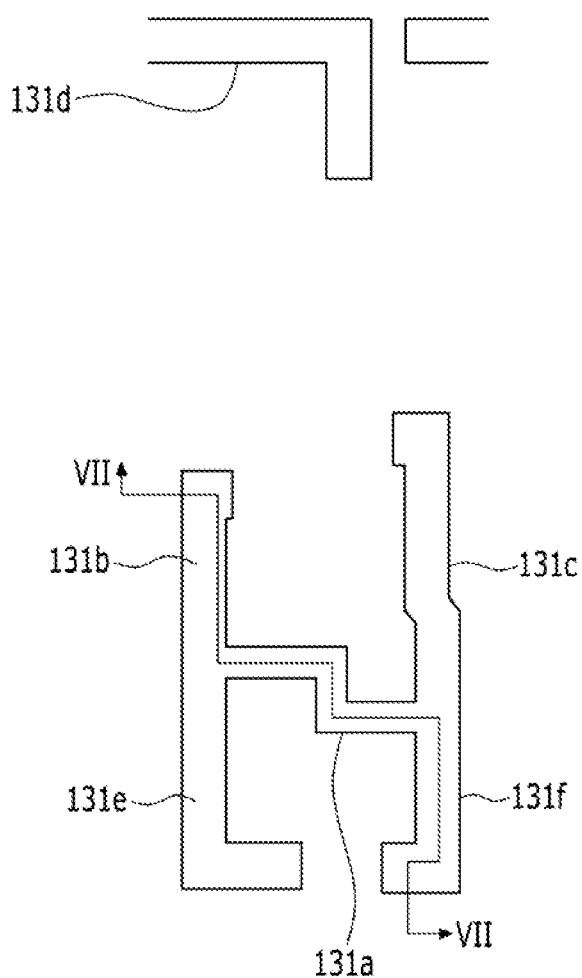
FIGS. 6, 8, 10 and 12 are layout views sequentially illustrating a method of manufacturing the organic light emitting diode display according to the exemplary embodiment.
Figure 7:
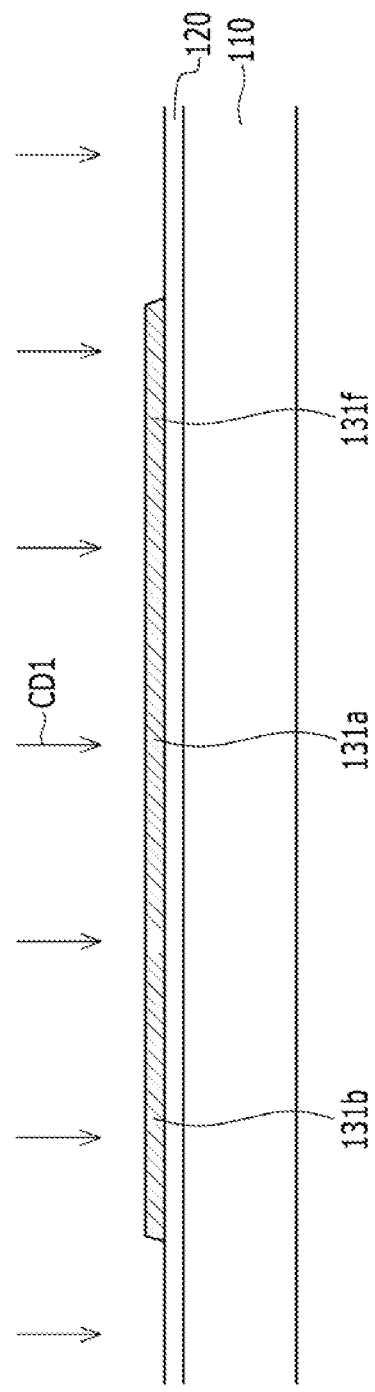
FIG. 7 is a cross-sectional view of the organic light emitting diode display of FIG. 6, which is taken along line VII-VII.
Figure 8:
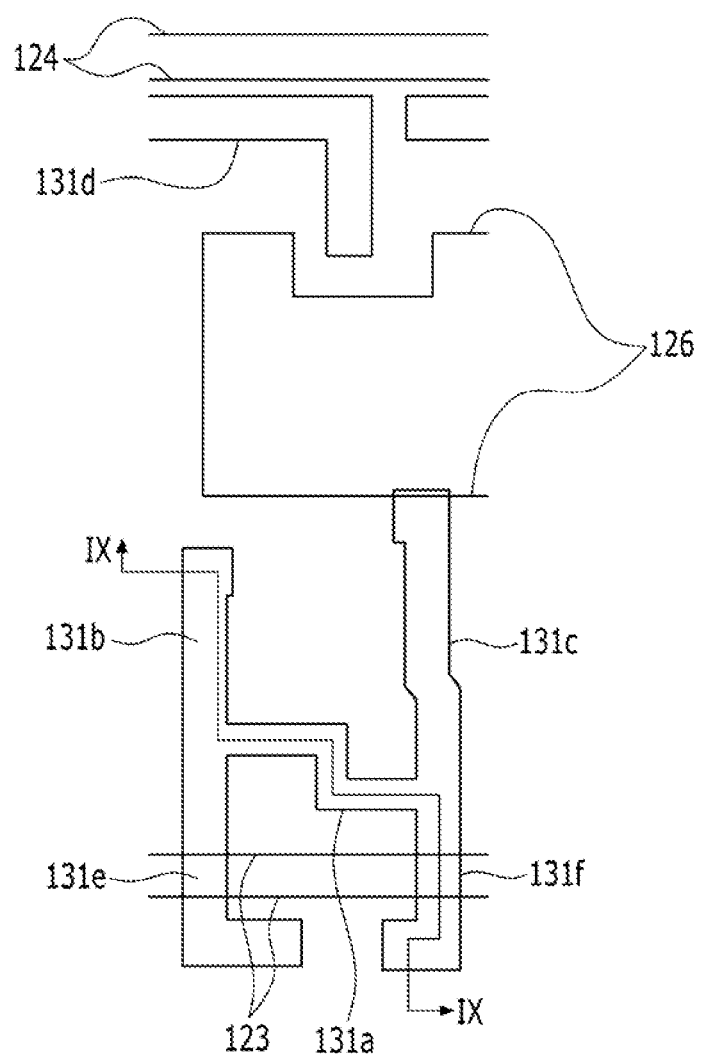
Figure 9:
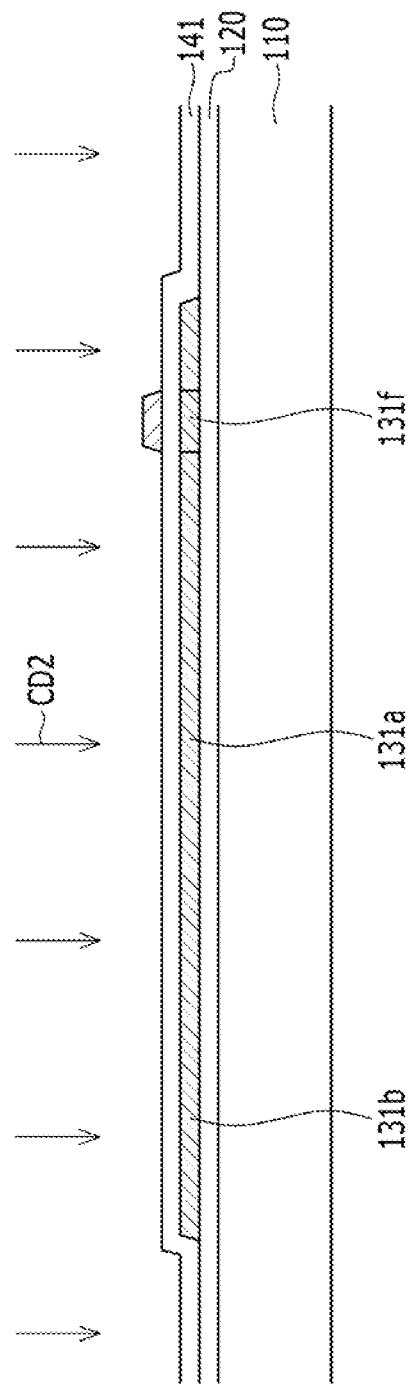
FIG. 9 is a cross-sectional view of the organic light emitting diode display of FIG. 8, which is taken along line IX-IX.
Figure 10:
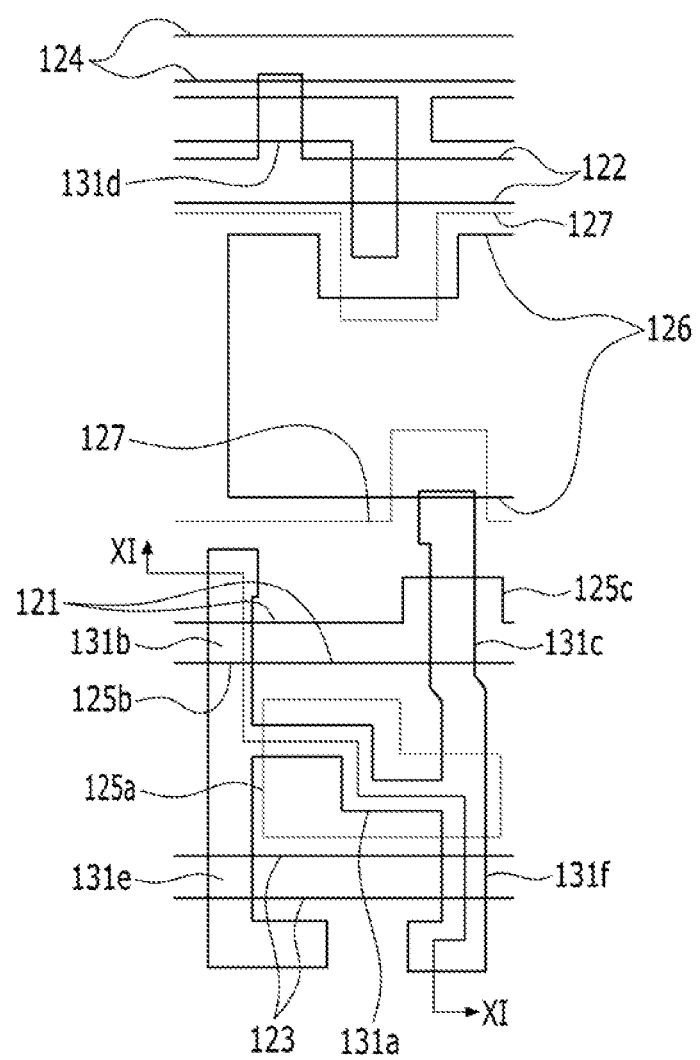
Figure 11:
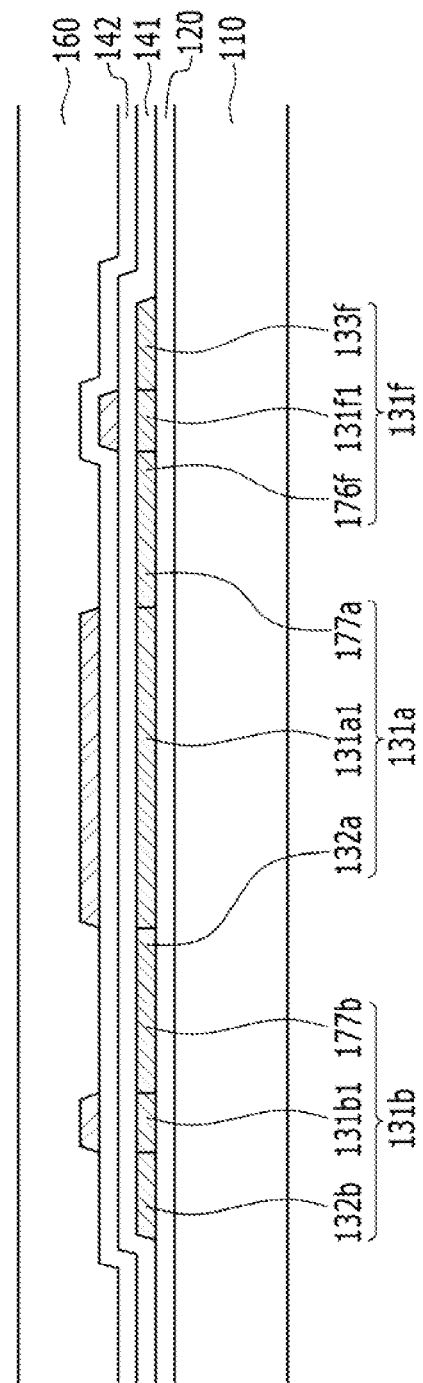
FIG. 11 is a cross-sectional view of the organic light emitting diode display of FIG. 10, which is taken along line XI-XI.
Figure 12:
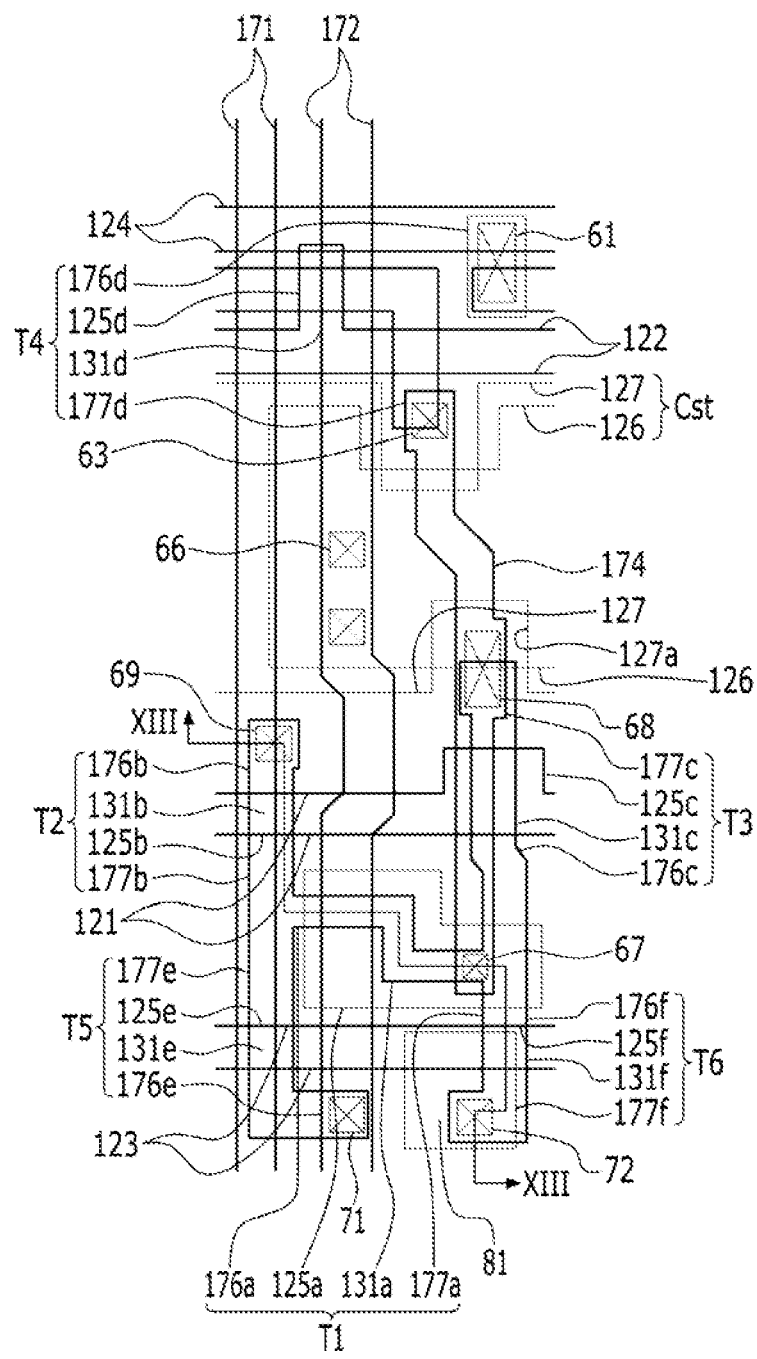
Figure 13:
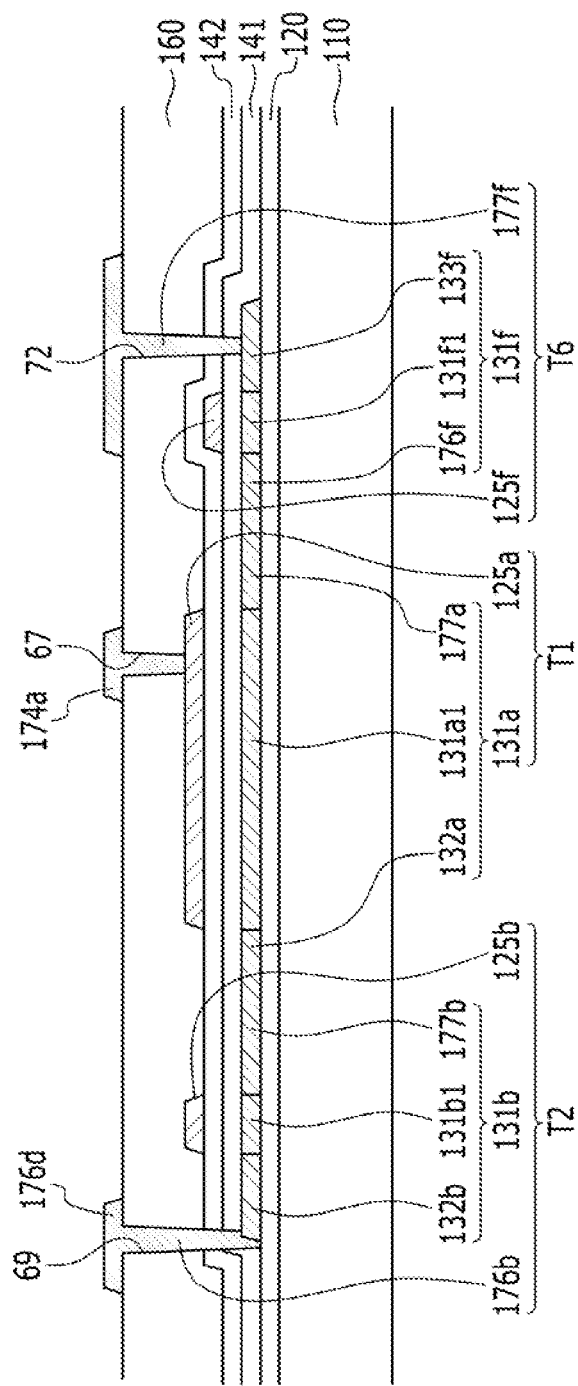
FIG. 13 is a cross-sectional view of the organic light emitting diode display of FIG. 12, which is taken along line XIII-XIII.

FIGS. 6, 8, 10, and 12 are layout views sequentially illustrating a method of manufacturing the organic light emitting diode display according to the exemplary embodiment, FIG. 7 is a cross-sectional view of the organic light emitting diode display of FIG. 6, which is taken along line VII-VII, FIG. 9 is a cross-sectional view of the organic light emitting diode display of FIG. 8, which is taken along line IX-IX, FIG. 11 is a cross-sectional view of the organic light emitting diode display of FIG. 10, which is taken along line XI-XI, and FIG. 13 is a cross-sectional view of the organic light emitting diode display of FIG. 12, which is taken along line XIII-XIII.

First, as illustrated in FIGS. 6 and 7, the buffer layer 120 is formed on the substrate 110. The substrate 110 may be formed of a transparent insulating substrate such as glass, quartz, or plastics. The buffer layer 120 may be formed of a single layer of silicon nitride or a laminate layer of silicon nitride and silicon oxide, and is deposited on an entire surface of the substrate 110 by a method such as plasma chemical vapor deposition (PECVD).

In addition, the semiconductor layer 131 is formed on the buffer layer 120. The semiconductor layer 131 may be formed of polysilicon or an oxide semiconductor, and the polysilicon may be formed by a method of forming an amorphous silicon layer and then crystallizing the layer. Various known methods may be applied as the crystallizing method, and for example, the amorphous silicon layer may be crystallized by using heat, a laser, Joule heat, an electric field, a catalyst metal, or the like. In addition, the semiconductor layer 131 is patterned by a photolithography process using a first mask. Thereby, the driving semiconductor layer 131a, the switching semiconductor layer 131b, the compensation semiconductor layer 131c, the initialization semiconductor layer 131d, the operation control semiconductor layer 131e, and the light emission control semiconductor layer 131f are simultaneously formed.

In addition, the driving semiconductor layer 131a, the switching semiconductor layer 131b, the compensation semiconductor layer 131c, the initialization semiconductor layer 131d, the operation control semiconductor layer 131e, and the light emission control semiconductor layer 131f are subjected to first channel doping CD1 by an N type impurity. In the exemplary embodiment, the first channel doping CD1 is performed by the N type impurity, but is not limited thereto, and the first channel doping CD1 may be performed by a P type impurity.

Next, as illustrated in FIGS. 8 and 9, the first gate insulating layer 141 covering the driving semiconductor layer 131a, the switching semiconductor layer 131b, the compensation semiconductor layer 131c, the initialization semiconductor layer 131d, the operation control semiconductor layer 131e, and the light emission control semiconductor layer 131f, is formed on the buffer layer 120. The first gate insulating layer 141 may be formed of silicon nitride ($SiN_x$), silicon oxide ($SiO_2$), or the like, and is deposited on an entire surface of the buffer layer 120 by a method such as plasma chemical vapor deposition (PECVD).

In addition, the first gate metal layer is formed on the first gate insulating layer 141. The first gate metal layer may be formed of a multilayer in which a metal layer including any one of copper (Cu), a copper alloy, aluminum (Al), and an aluminum alloy, and a metal layer including any one of molybdenum (Mo) and a molybdenum alloy, are laminated. In addition, the first gate metal layer is patterned by a photolithography process using a second mask to form the first gate wires 123, 125e, 125f, 124, and 126. In this case, the light emission control gate electrode 125f is formed at a position overlapping the light emission control semiconductor layer 131f, and the operation control gate electrode 125e is formed at a position overlapping the operation control semiconductor layer 131e.

In addition, the semiconductor layer 131 is subjected to second channel doping CD2 by using the light emission control gate electrode 125f and the operation control gate electrode 125e as a blocking mask. In this case, the impurity used in the second channel doping CD2 may be an impurity of the same type as the impurity used in the first channel doping CD1, and in the present exemplary embodiment, since the impurity used in the first channel doping CD 1 is an N type impurity, the impurity used in the second channel doping CD2 may be an N type impurity.

Accordingly, only the driving semiconductor layer 131a, the switching semiconductor layer 131b, the compensation semiconductor layer 131c, and the initialization semiconductor layer 131d are subjected to the second channel doping CD2, but the operation control semiconductor layer 131e and the light emission control semiconductor layer 131f are not subjected to the second channel doping CD2, and thus, the doping concentration of the driving semiconductor layer 131a, the switching semiconductor layer 131b, the compensation semiconductor layer 131c, and the initialization semiconductor layer 131d is higher than the doping concentration of the operation control semiconductor layer 131e and the light emission control semiconductor layer 131f.

Next, as illustrated in FIGS. 10 and 11, the second gate insulating layer 142 covering the first gate wires 123, 125e, 125f, 124, and 126 is formed on the first gate insulating layer 141. In addition, the second gate metal layer is formed on the second gate insulating layer 142. The second gate metal layer may be formed of a multilayer in which a metal layer including any one of copper (Cu), a copper alloy, aluminum (Al), and an aluminum alloy, and a metal layer including any one of molybdenum (Mo) and a molybdenum alloy, are laminated. In addition, the second gate metal layer is patterned by a photolithography process using a third mask to form second gate wires 125a, 125b, 125c, 125d, 121, 122, and 127.

In addition, all semiconductor layers 131a, 131b, 131c, 131d, 131e, and 131f are subjected to source and drain doping (SD) by a P type impurity having a type that is opposite to that of the N type impurity used in the first channel doping and the second channel doping so as to classify all of the semiconductor layers 131a, 131b, 131c, 131d, 131e, and 131f into the channel region, the source region, and the drain region. In this case, all of the gate electrodes 125a, 125b, 125c, 125d, 125e, and 125f serve to prevent the P type impurity from being doped in the channel region when the P type impurity is doped in the source region and the drain region.

The doping concentration of the channel region of the driving semiconductor layer 131a, the switching semiconductor layer 131b, the compensation semiconductor layer 131c, and the initialization semiconductor layer 131d is higher than the doping concentration of the channel region of the operation control semiconductor layer 131e and the light emission control semiconductor layer 131f, the doping concentration of the channel region of the driving semiconductor layer 131a, the switching semiconductor layer 131b, the compensation semiconductor layer 131c, and the initialization semiconductor layer 131d may be $2\times10^{11}$ to $5\times10^{13}$ /$cm^3$, and the doping concentration of the channel region of the operation control semiconductor layer 131e and the light emission control semiconductor layer 131f may be $9\times10^{10}$ /$cm^3$ or less.

In addition, the interlayer insulating layer 160 covering the second gate wires 125a, 125b, 125c, 125d, 121, 122, and 127 is formed on the second gate insulating layer 142. The interlayer insulating layer 160 is formed of an organic layer or an inorganic layer, and deposited on the entire surface.

Next, as illustrated in FIGS. 12 and 13, the interlayer insulating layer 160, the first gate insulating layer 141, and the second gate insulating layer 142 are patterned by a photolithography process using a fourth mask to form a plurality of contact holes 61, 63, 66, 67, 68, 69, 71, and 72.

In addition, a data metal layer is formed on the interlayer insulating layer 160. The data metal layer may be formed of a multilayer in which a metal layer including any one of copper, a copper alloy, aluminum, and an aluminum alloy, and a metal layer including any one of molybdenum and a molybdenum alloy, are laminated. For example, the data metal layer may be formed of a Mo/Al/Mo triple layer or a Mo/Cu/Mo triple layer.

In addition, the data metal layer is patterned by a photolithography process using a fifth mask. Thereby, data wires including the data line 171, including the switching source electrode 176b, the driving voltage line 172, the connection member 174, and the light emission control drain electrode 177f, are formed on the interlayer insulating layer 160.

Next, as illustrated in FIGS. 3 to 5, the protective layer 180 covering the data wires 171, 172, 174, and 177f is formed on the interlayer insulating layer 160, and a contact hole 81 is formed in the protective layer 180 by a photolithography process using a sixth mask. Furthermore, the pixel electrode layer is formed on the protective layer 180, and is patterned by a photolithography process using a seventh mask to form a pixel electrode 191 connected through the contact hole 81 to the light emission control drain electrode 177f. In addition, the barrier rib 350 covering the pixel electrode 191 is formed on the protective layer 180, and the barrier rib opening 351, through which a portion of the pixel electrode 191 is exposed, is formed in the barrier rib 350 by using an eighth mask. Furthermore, the organic emission layer 370 is formed on the pixel electrode 191 exposed through the barrier rib opening 351 of the barrier rib 350. In addition, the organic light emitting diode 70 is completed by forming the common electrode 270 on the organic emission layer 370. The common electrode 270 is formed on the barrier rib 350 so as to be formed over a plurality of pixels.

A sealing member (not illustrated) for protecting the organic light emitting diode 70 may be formed on the common electrode 270, may be sealed by a sealant on the substrate 110, and may be formed of various materials such as glass, quartz, ceramic, plastics, and metal. Meanwhile, a sealing thin film layer may be formed by depositing an inorganic layer and an organic layer on the common electrode 270 while not using the sealant.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display, comprising:
   a substrate;
   a semiconductor layer formed on the substrate and including a switching semiconductor layer, a driving semiconductor layer, and a light emission control semiconductor layer spaced apart from each other, the light emission control semiconductor layer being used to select a pixel to emit light;
   a first gate insulating layer covering the semiconductor layer;
   a light emission control gate electrode formed on the first gate insulating layer and overlapping the light emission control semiconductor layer;
   a second gate insulating layer covering the light emission control gate electrode;
   a switching gate electrode and a driving gate electrode formed on the second gate insulating layer and respectively overlapping the switching semiconductor layer and the driving semiconductor layer; and
   an interlayer insulating layer covering the switching gate electrode, the driving gate electrode, and the second gate insulating layer;
   a doping concentration of a channel region of the driving semiconductor layer being higher than a doping concentration of the channel region of the light emission control semiconductor layer, a doping impurity of the channel region of the driving semiconductor layer and a doping impurity of the channel region of the light emission control semiconductor layer being a same type of doping impurity.

2. The organic light emitting diode display of claim 1, the doping concentration of the channel region of the driving semiconductor layer being $2 \times 10^{11}$ to $5 \times 10^{13}$ /cm$^3$, and the doping concentration of the channel region of the light emission control semiconductor layer being not greater than $9 \times 10^{10}$ /cm$^3$.

3. The organic light emitting diode display of claim 1, a doping impurity of the channel region of the driving semiconductor layer and a doping impurity of the channel region of the light emission control semiconductor layer each being any one of an N type impurity and a P type impurity and different types of doping impurities.

4. An organic light emitting diode display, comprising:
   a substrate;
   a semiconductor layer formed on the substrate and including a switching semiconductor layer, a driving semiconductor layer, and a light emission control semiconductor layer spaced apart from each other, the light emission control semiconductor layer being used to select a pixel to emit light;
   a first gate insulating layer covering the semiconductor layer;
   a light emission control gate electrode formed on the first gate insulating layer and overlapping the light emission control semiconductor layer;
   a second gate insulating layer covering the light emission control gate electrode;
   a switching gate electrode and a driving gate electrode formed on the second gate insulating layer and respectively overlapping the switching semiconductor layer and the driving semiconductor layer;
   an interlayer insulating layer covering the switching gate electrode, the driving gate electrode, and the second gate insulating layer, a doping concentration of a channel region of the driving semiconductor layer being higher than a doping concentration of the channel region of the light emission control semiconductor layer;
   a scan line formed on the substrate and transferring a scan signal;
   a data line and a driving voltage line crossing the scan line and transferring a data signal and a driving voltage, respectively;
   a switching transistor connected to the scan line and the data line and including the switching semiconductor layer and the switching gate electrode;

a driving transistor connected to a switching drain electrode of the switching transistor and including the driving semiconductor layer and the driving gate electrode; and an organic light emitting diode connected to a driving drain electrode of the driving transistor;

a doping concentration of a channel region of the switching semiconductor layer being the same as the doping concentration of the channel region of the driving semiconductor layer.

5. The organic light emitting diode display of claim 4, the first gate insulating layer and the second gate insulating layer being formed between the driving semiconductor layer and the driving gate electrode of the driving transistor.

6. The organic light emitting diode display of claim 5, the first gate insulating layer and the second gate insulating layer being formed between the switching semiconductor layer and the switching gate electrode of the switching transistor.

7. The organic light emitting diode display of claim 4, further comprising:

an operation control transistor turned-on by a light emission control signal transferred by a light emission control line spaced apart from the scan line to transfer the driving voltage to the driving transistor; and a light emission control transistor turned-on by the light emission control signal so as to transfer the driving voltage from the driving transistor to the organic light emitting diode;

the first gate insulating layer being formed between a light emission control semiconductor layer and a light emission control gate electrode of the light emission control transistor; and a doping concentration of a channel region of an operation control semiconductor layer of the operation control transistor being the same as a doping concentration of a channel region of the light emission control semiconductor layer.

8. The organic light emitting diode display of claim 7, further comprising:

a compensation transistor turned-on by a scan signal so as to compensate a threshold voltage of the driving transistor, and connected to the driving transistor; and an initialization transistor turned-on according to a prior scan signal transferred through a prior scan line spaced apart from a scan line so as to transfer an initialization voltage, transferred through an initialization voltage line adjacent to the prior scan line, to a driving gate electrode of the driving transistor;

the first gate insulating layer and a second gate insulating layer being formed in the compensation transistor and the initialization transistor; and the doping concentrations of channel regions of a compensation semiconductor layer of the compensation transistor and of an initialization semiconductor layer of the initialization transistor being the same as the doping concentration of the channel region of the driving semiconductor layer.

9. The organic light emitting diode display of claim 8, further comprising a storage capacitor including a first storage capacitive plate formed on the first gate insulating layer and a second storage capacitive plate formed on the second gate insulating layer and covering the first storage capacitive plate and overlapping the first storage capacitive plate;

a driving voltage line being connected to the second storage capacitive plate.

10. A method of manufacturing an organic light emitting diode display, comprising the steps of:

forming a semiconductor layer on a substrate;

performing first channel doping on the semiconductor layer;

forming a first gate insulating layer covering the semiconductor layer;

forming a light emission control gate electrode on the first gate insulating layer, the light emission control gate electrode being used to select a pixel to emit light;

performing second channel doping on the semiconductor layer by using the light emission control gate electrode as a blocking mask;

forming a second gate insulating layer covering the light emission control gate electrode and the first gate insulating layer;

forming a switching gate electrode and a driving gate electrode on the second gate insulating layer;

performing source and drain doping on the semiconductor layer so as to form a driving semiconductor layer, a switching semiconductor layer, and a light emission control semiconductor layer; and forming an interlayer insulating layer covering the switching gate electrode and the driving gate electrode on the second gate insulating layer, a doping impurity used in the first channel doping and a doping impurity used in the second channel doping being a same type of doping impurity.

11. The method of manufacturing an organic light emitting diode display of claim 10, a doping concentration of a channel region of the driving semiconductor layer being higher than a doping concentration of a channel region of the light emission control semiconductor layer.

* * * * *